(12) United States Patent
Fangerau et al.

(10) Patent No.: US 9,176,391 B2
(45) Date of Patent: Nov. 3, 2015

(54) METHOD AND ARRANGEMENT FOR DISPLACEMENT

(75) Inventors: Michael Fangerau, Leimen (DE); Alexander Mangold, Ludwigshafen (DE); Roland Kaplan, Heidelberg (DE)

(73) Assignee: Heidelberg Instruments Mikrotechnik GMBH, Heidelberg (DE)

( * ) Notice: Subject to any disclaimer, the term of this patent is extended or adjusted under 35 U.S.C. 154(b) by 0 days.

(21) Appl. No.: 12/922,040

(22) PCT Filed: Mar. 10, 2009

(86) PCT No.: PCT/EP2009/001705
§ 371 (c)(1),
(2), (4) Date: Sep. 10, 2010

(87) PCT Pub. No.: WO2009/112239
PCT Pub. Date: Sep. 17, 2009

(65) Prior Publication Data
US 2011/0007322 A1 Jan. 13, 2011

(30) Foreign Application Priority Data
Mar. 10, 2008 (DE) .......................... 10 2008 013 504

(51) Int. Cl.
*G01B 11/02* (2006.01)
*G03F 7/20* (2006.01)
*G02B 26/08* (2006.01)

(52) U.S. Cl.
CPC ........ *G03F 7/70258* (2013.01); *G02B 26/0875* (2013.01)

(58) Field of Classification Search
CPC .............................. G03F 7/70258; G01J 3/453
USPC ......... 356/450, 455, 456, 485, 498, 508, 510, 356/517
See application file for complete search history.

(56) References Cited

U.S. PATENT DOCUMENTS

| 5,218,415 A | 6/1993 | Kawashima |
| 5,331,399 A * | 7/1994 | Tank et al. ..................... 356/455 |
| 5,510,892 A * | 4/1996 | Mizutani et al. ........... 356/139.1 |

(Continued)

FOREIGN PATENT DOCUMENTS

| DE | 239 658 | 10/1986 |
| DE | 38 20 170 | 12/1989 |
| EP | 1 107 068 | 6/2001 |

*Primary Examiner* — Michael A Lyons
*Assistant Examiner* — Hina F Ayub
(74) *Attorney, Agent, or Firm* — Jordan and Hamburg LLP

(57) ABSTRACT

A method and apparatus operable for displacing an image, which is transmitted by electromagnetic radiation, perpendicular to the direction of radiation by use of a rotatably disposed radiation-refracting body, located in the path of an imaging beam, having a refractive index that differs from the surrounding medium with regard to the radiation used. The method allows for precise image displacement. The rotation of the radiation-refracting body causing the displacement is measured, and the change of the optical path length caused by the angular change in a further electromagnetic beam utilized for the measurement is determined by evaluating the superimposition of the radiation reflected by a planar reflecting surface with the incident electromagnetic radiation. Part of the electromagnetic measurement beam, which is reflected on the surface of the radiation-refracting body, strikes a measurement unit, which supplies an electrical signal as a function of the incident position of the electromagnetic radiation.

11 Claims, 2 Drawing Sheets

(56) References Cited

U.S. PATENT DOCUMENTS

| | | | |
|---|---|---|---|
| 5,550,635 A * | 8/1996 | Saitoh et al. | 356/401 |
| 5,625,436 A | 4/1997 | Yanagihara et al. | |
| 6,369,951 B1 * | 4/2002 | Spanner | 359/629 |
| 2003/0202171 A1 * | 10/2003 | Kennedy et al. | 356/73.1 |

* cited by examiner

METHOD AND ARRANGEMENT FOR DISPLACEMENT

BACKGROUND OF THE INVENTION

The invention relates to a method for displacing an image transferred using electromagnetic radiation and to an apparatus for performing the method.

A known method and an apparatus for using electromagnetic radiation to transfer images or reproductions corresponding to a mask onto a photo-sensitive layer of a substrate is disclosed in U.S. Pat. No. 5,625,436. In accordance with the disclosure, are bodies that are arranged rotatable about axes and the refraction index of which is different from the refraction index of the ambient air are present in the beam path between the mask and the substrate, and which are embodied as planar glass plates. These bodies can be adjusted by means of suitable drives corresponding to the provided image displacement.

As is known, an electromagnetic beam that strikes, at an angle, the beam refracting body or a medium having a different density that is embedded in a surrounding medium and that has a planar surface is, in particular, refracted when it enters the medium. If the opposing interface of the body or medium is parallel to the incident surface, when the beam exits the medium, it is refracted again at the same angle in the opposing direction because of symmetry. Thus, the beam is offset, and the magnitude of the offset is a function of the angle between the beam and the body or medium, the latter which is embodied, in particular, as a plane parallel glass plate. This property is used for adjustably laterally displacing the reproduction generated by means of an electromagnetic beam, wherein the medium, in particular the plane parallel plate, is arranged rotatable in the aforesaid beam. The accuracy with which the reproduction position can be adjusted in this manner is a function of how precise and reproducible is the angle of adjustment of the body or medium, for example, the plate.

Furthermore an apparatus for optically measuring the inclination of a surface of a wafer is known from U.S. Pat. No. 5,218,415, in which a light beam is reflected on the surface of the wafer. The beams reflected in different directions corresponding to the inclination of the wafer are aligned parallel to one another by a lens and supplied to a unit for determining the angle of inclination.

Moreover, sensors that are embodied as interferometers and that contain a radiation-refracting body are known from laid-open specification DE 38 20 170 A1 and patent specification DD 239 658 A1. The beam refracting body is arranged in the beam path of a reference radiation such that the angle of incidence of the radiation onto the surface of the radiation-refracting body can be changed based on its movements. Signals that correspond to the movements of the aforesaid body are generated by overlaying the radiation that penetrates the aforesaid body and the reference radiation due to the resultant interference.

Proceeding from this point, the object of the invention is to refine the method and the apparatus of the aforesaid type with low complexity such that an optimized and/or precise image displacement is attained. Moreover, a high resolution adjustment of the image position and/or a high resolution control of the rotation of the radiation-refracting body provided for the image displacement is also to be provided. The method should be simple to perform, it should be possible to perform the method with reproducible values, and the apparatus should not be structurally complex.

SUMMARY OF THE INVENTION

This object is attained by a method and an apparatus according to the invention.

The proposed method and the apparatus for performing said method enable high resolution and precise adjustment of the image position, high resolution control and/or regulation of the rotation and/or adjustment of the radiation-refracting body occurring by means of an interferometer. The method and the apparatus use the same effect of offsetting both for controlling the position of the reproduction beam and also for measuring the change in the angle and/or in the angle of the body. The combination of the image displacement and the measurement occurs jointly and/or with the same radiation-refracting body, wherein, for the measurement, the beam produced additionally by means of the interferometer unit, especially an electromagnetic beam, is oriented through the radiation-refracting body onto a reflecting, especially flat, surface, especially a planar mirror, and from there is reflected onto the interferometer unit, and a signal corresponding to the adjustment or change in the angle of rotation of the aforesaid body is thus produced.

In a preferred manner, the reproducing beam and/or the beam from the interferometer unit strike the radiation-refracting body at least approximately in the same area and/or the same location on its surface and/or at least approximately essentially on its rotational axis. Moreover, it is particularly significant that the measurement beam from the interferometer is partly reflected at the incident surface and/or the surface of the rotatable radiation-refracting body and is directed onto a measuring device that supplies an in particular electrical signal as a function of the direction of incidence and/or the position of the electromagnetic measurement beam. In accordance with the invention, the measuring unit, which in particular is embodied as, or contains a position detector, supplies a defined starting point and/or a reference signal for the rotational angle and/or the position of the radiation-refracting body with great accuracy. This permits absolute adjustment of the rotational angle of the body and also absolute displacement and/or displacement with an absolute pre-specified value of the reproduction and/or the image to be displaced. In a preferred manner, the same body is used for three functions, specifically image displacement, angle measurement, and finding the reference value. Both the reference value and the measurement signals for the angle measurement are used in a closed circuit for adjusting and/or controlling the absolute image displacement as a function of a pre-specifiable target value.

The absolute image displacement preferably occurs on an axis and/or direction perpendicular to the reproducing beam by means of controlled and/or regulated rotation of the radiation-refracting body, specifically taking into account the null point or reference value pre-specified and/or measured and/or defined in accordance with the invention. In accordance with the invention, high resolution control and/or regulation of the rotation of the radiation-refracting body is performed for the image displacement and a defined reference value and/or starting point for the rotation or rotations of the body is provided and/or taken into account with great accuracy, absolute movements of the body being enabled proceeding from the starting point and/or reference value.

The proposed method and apparatus use the same effect of the offset that is used for controlling the position of the reproduction beam, also for measuring the angle change of the body, especially during an adjustment procedure, the change in the path length of the measurement beam running through the body being measured interferometrically. It should be noted that, in contrast to a measurement for instance using an encoder disk attached to a rotational shaft of the drive or motor that moves the body, the method and apparatus make direct measurement possible, since the active radiation-refracting body also acts as the sensor, so that high resolution detection and/or determination of the angle change is advantageously made possible during the movement. Moreover, it should be noted that the position of the beam reflected on the surface of the body is also used for establishing the absolute null point or reference value for the movement of the body.

Special embodiments and refinements of the invention are provided in the following description of a special exemplary embodiment.

Using the structure depicted as an example in the drawings, the method and the apparatus of the absolute image displacement and, in particular, the methods employed with them to measure the position of the radiation-refracting body, embodied in particular as plane parallel glass plate, shall be explained in the following, but this shall not constitute a restriction of the invention.

DETAILED DESCRIPTION OF THE INVENTION

Figure 1:
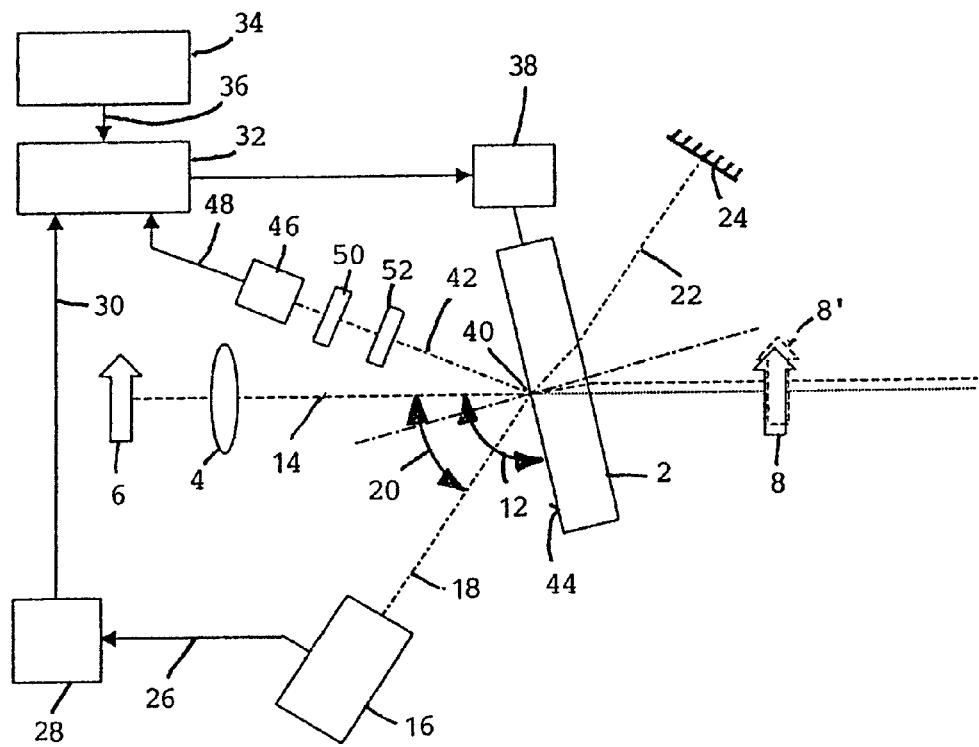
FIG. 1 is a schematic depiction of the entire apparatus, including the additional components, in accordance with an embodiment of the invention.

In the exemplary apparatus in accordance with FIG. 1, the plane parallel plate 2 acts as a radiation-refracting body for lateral positioning of the reproduction of an object 6 generated by means of a reproduction optics unit 4. The object and/or image is generated by means of a radiation source (not depicted in greater detail here), in particular a laser, and a preferably programmable mask of a photolithography system, and is reproduced, for instance, as an image 8 on a substrate or wafer. The lateral position is a function of the angle position 12 of the plane parallel plate 2 with respect to the electromagnetic radiation or the reproduction beam 14. If, for example, the angle 12 is 90°, the reproduction beam 12 is not refracted in the plate 2 and the image 8 assumes the position depicted with the solid line. In contrast, if the plate 2 is tilted, as depicted, the position 8' is as indicated with the broken line. In order to be able to determine absolutely and with high resolution the situation for the actual angle position, an interferometer arrangement or interferometer unit 16 is provided, by means of which a measurement beam 18 is directed at the plate 2 at a pre-specified angle 20. The interferometer unit 16 includes another radiation source, especially another laser, an interferometer optics unit, and a detector.

A first beam component 22 passes through the plate 2 and strikes a reflecting surface and/or a plane mirror 24 and is reflected onto itself and/or onto the same path and travels back to the interferometer arrangement 16. Due to the change in the optical path length of the measurement beam 18 because of the plate 2 being rotated, an interferometer arrangement 16 produces interferometric signals 26 that are supplied to an interferometer electronics unit 28 that is embodied, in particular, as a counting unit The output signals 30 from the electronics unit 28 are supplied to an evaluation electronics unit 32, and are used for determining the angle 12 and/or the angle change during a movement, in particular a rotation, of the plate 2. A target value signal is input into the evaluation electronics unit 32 by means of an external target value generator 34. The control deviation from the target value signal 36 and from the actual value signal 30 is provided to a control electronics unit or electronic rotation unit 38 having a rotational drive for the plate 2. Thus, a closed control circuit is created, the evaluation electronics unit 32 forming the controller and/or, in particular, enabling the target value/actual value comparison. The plate 2 may be rotated by means of the rotational drive about an axis 40 that is preferably intersected by the reproduction beam 14 and the measurement beam 18. The axis 40 runs essentially orthogonal to the plane of the drawing.

A second beam component 42 of the measurement beam 18 is reflected at the surface 44 and directed onto a measuring device and/or position detector 46. The position detector 46 includes, for example, a differentiation diode, the signal height and signal polarity of which, are a function of the position of the second beam component 42 relative to the center point. The position signal 48 obtained in this manner is also supplied to the evaluation electronics unit and/or the controller 32. In accordance with the invention, a reference signal and/or a defined null point for a defined and/or pre-specified position of the plate 2 is produced by means of the position detector 46. Taking into account the reference value found in this manner and/or the absolute null point for the movement of the plate 2 defined in this manner, the plane parallel plate 2 is rotated in a controlled or regulated manner as a function of the target value signal(s) 36 input in particular by means of the external target value generator 34, specifically starting from the defined null point pre-specified by means of and/or via the measuring device 46, and consequently an absolute image displacement is performed.

A process for adjusting the absolute image displacement is initiated, in particular, by a target value input from the external target value generator 34. In the first method step the actuation or rotation electronics unit 38 for the plate 2 is actuated via the evaluation electronics unit 32 using the signal obtained from the position detector 46 such that the reflected partial beam, i.e., the second beam component 42, is moved to the center of the differentiation diode. From this defined starting point or reference signal, in a second step, the plate 2 is then itself moved in the required direction long enough and/or far enough until the output signal or counting signal 30 from the interferometer electronics unit 28, which represents the angle change, is equal to the target value 36. Depending on the type of electromagnetic radiation used for the measurement beam 18 or the detectors used in the position detector 46, a wave filter 50 and/or polarization filter 52 may also be arranged upstream of the position detector 46 for the second beam component 42.

Figure 2:
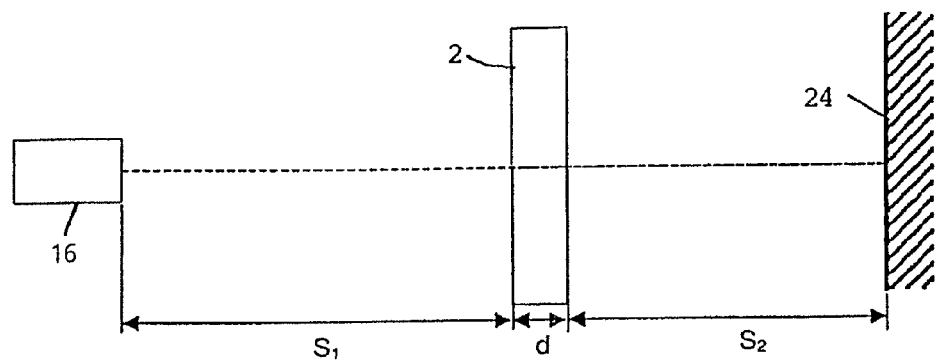
FIG. 2 is a depiction explaining the symbols used for calculating the change in the path length of the beam that is used for measuring the angle change of the plane parallel plate.

In the following, the method for measuring the angle change by means of interferometric measurement of the change in the path length of a measurement beam 18 running through the plane parallel plate 2 is explained more precisely using the symbols shown in FIGS. 2 and 3. The optical path length of the measurement beam 18 results from the distance from the beam source for the interferometer arrangement 16 to the incident point on the plate 2, the path inside the plate 2, and the path between exit point from the plate 2 and the plane mirror 24, each modified by the optical density of the media through which the beam passes. Without limiting the invention in general, it is moreover assumed that the beam passes through air at n=1 outside the plane parallel plate 2. Both the path length inside the plate 2 and the path length between plate 2 and mirror 24 depend on the angle position of the plate 2. If the plate 2 is perpendicular to the incident beam or measurement beam 18, in accordance with FIG. 2, the beam is not refracted. The path length L is found from the distances $S_1$ and $S_2$ along the axis of the incident beam 18 and the plate thickness d:

$$L = S_1 + n_{Glass} \cdot d + S_2.$$

Figure 3:
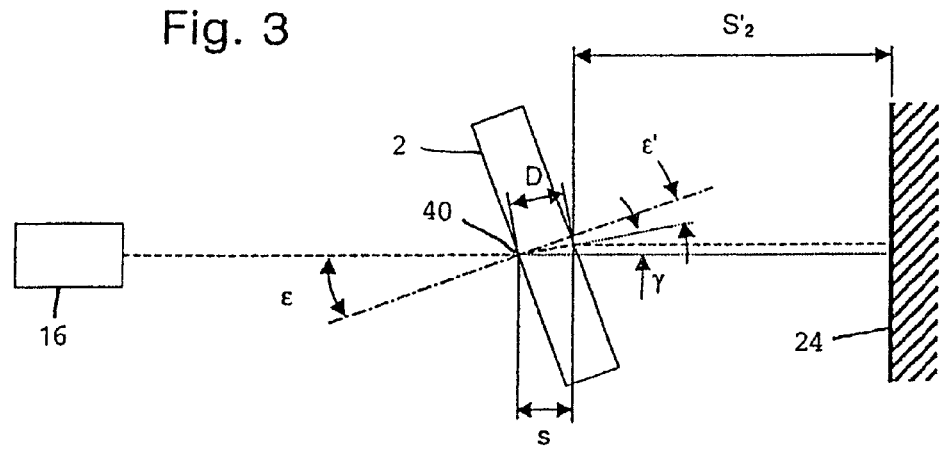
FIG. 3 is another depiction explaining remaining symbols used for calculating the change in the path length of the beam that is used for measuring the angle change of the plane parallel plate.

If, in accordance with FIG. 3, the plate 2 is rotated about the rotational axis 40 by an angle $\epsilon$, this refracts the beam 18 inside the plate 2 by the angle $\gamma$ to its incident direction. It passes through the plate 2 at the angle $\epsilon^1$ to the vertical, and the path covered is:

$$D = \frac{d}{\cos \varepsilon'}. \quad (1)$$

The segment from the exit out of the plate 2 to the mirror 24 is found from:

$$S'_2 = S_2 + d - s,$$

where s is the segment traveled inside the plate 2 parallel to the original axis:

$$s = D\cos\gamma = d \frac{\cos\gamma}{\cos\varepsilon'} \quad (2)$$

The optical path length after the rotation is found from:

$$L' = S_1 + n_{Glass} \cdot D + S_2 + d - s.$$

The difference in the optical path lengths between these two cases is thus $\Delta L = L^1 - L = n_{Glass} \cdot (D-d) + d - s$. and by inserting equations (1) and (2) and the law of refraction $\sin \epsilon = n_{Glass} \cdot \sin \epsilon^1$ and the following rearrangement results:

$$\Delta L = d(\sqrt{n_{Glass}^2 - \sin^2 \epsilon} + 1 - \cos \epsilon - n_{Glass})$$

For an angle $\epsilon$ that is small enough, the following applies approximately:

$$\Delta L = d(\sqrt{n_{Glass}^2 - \sin^2 \epsilon} - n_{Glass})$$

The change in the optical path length as a function of the change in the angle is found from the derivation of this relationship:

$$\frac{\partial \Delta L}{\partial \varepsilon} = d \sin\varepsilon \left(1 - \frac{\cos\varepsilon}{\sqrt{n_{Glass}^2 - \sin^2 \varepsilon}}\right).$$

Thus, in an interferometer with the resolution $x_{tic}$, at an angle change about $\Delta \epsilon$ $$\Delta Z = \frac{d}{x_{tic}} \sin\varepsilon \left(1 - \frac{\cos\varepsilon}{\sqrt{n_{Glass}^2 - \sin^2 \varepsilon}}\right) \Delta \varepsilon$$

counting impulses are triggered. The number of required impulses can be calculated in the controller electronics unit, item 32 in FIG. 1, from the required angle position and the movement can be triggered appropriately.

The achievable resolution in the image displacement is limited by the resolution of the path length measurement by the interferometer and comes from the above formulas assuming a small angle:

$$\tau = \frac{x_{tic} \frac{n_{Glass} - 1}{n_{Glass}}}{\sin\varepsilon\left(1 - \frac{\cos\varepsilon}{\sqrt{n_{Glass}^2 - \sin^2 \varepsilon}}\right)}$$

With typical interferometer resolutions of 9.89 nm, this resolution is significantly higher than the resolution that can be achieved, for example, for an angle measurement by means of an encoder disk.

The invention claimed is:

1. A method of displacing an image, where the image is being transferred using electromagnetic radiation of a reproduction beam having a beam direction, the image being displaced perpendicular to the beam direction by use of a rotatably arranged radiation-refracting body that is disposed in a course of the reproduction beam and that has a refraction index different from an ambient medium with respect to said radiation, wherein the radiation-refracting body comprises at least one of either a plane parallel medium or a glass plate, the method comprising:

rotating the radiation-refracting body;

directing the reproduction beam to an area on the radiation-refracting body;

directing a measurement beam distinct from the reproduction beam from an interferometer to said area of the radiation-refracting body as the radiation-refracting body rotates, wherein said measurement beam impinges on said area at each of various rotational positions of the radiation-refracting body, wherein at each of said various rotational positions the measurement beam comprises a first radiation component and a corresponding second radiation component, wherein the first radiation component passes through the radiation-refracting body to a flat reflecting surface distinct from the radiation-refracting body where it is reflected back to and at least in part through the radiation-refracting body and onward to the interferometer to have a different wavelength than the measurement beam as directed to an incident surface of the radiation-refracting body, and wherein the corresponding second radiation component is reflected from the incident surface at said area to a measuring device distinct from the interferometer;

measuring rotation of the radiation-refracting, body by determining an optical path length change in the measurement beam caused by the radiation-refracting body, wherein said determining said optical path length change is performed by said interferometer and comprises evaluating radiation of the first radiation component reflected back to and at least in part through the radiation-refracting body to the interferometer relative to radiation corresponding to the measurement beam as output from the interferometer and directed to the incident surface of the radiation-refracting body;

deriving a position-dependent electrical signal by the measuring device based on the corresponding second radiation component to provide a reference point of origin for motion of the radiation-refracting body;

supplying the position-dependent electrical signal and the measured rotation to a control unit for controlling rotation and offset of the radiation-refracting body relative to said reference point of origin;

displacing said image of the radiation-refracting body in response to the reproduction beam; and controlling said rotation and offset of the radiation-refracting body with said controller to achieve a desired absolute displacement of the image relative to said reference point of origin, wherein said controlling is based on the measured rotation of the radiation-refracting body and said offset of the radiation-refracting body relative to said reference point of origin as determined from the measured rotation and the position-dependent electrical signal using said first component and corresponding second component as occurring during a rotational interval of the rotating body.

2. A method according to claim 1, wherein said evaluating the measurement beam radiation includes measuring an intensity of a temporally constant overlaying pattern or by measuring temporal changes in a corresponding intensity of the overlaying pattern.

3. A method according to claim 2, wherein said interferometer is a Michelson interferometer or a heterodyne interferometer, and said measuring an intensity of a temporally constant overlaying pattern or by measuring temporal changes in a corresponding intensity of the overlaying pattern include use of said Michelson interferometer or heterodyne interferometer, respectively.

4. A method according to claim 1, wherein the measuring device forms the position-dependent electrical signal from a difference in intensities from at least two detectors that are sensitive to electromagnetic radiation.

5. A method according to claim 1, wherein the measuring device forms the position-dependent electrical signal directly from at least one detector that is sensitive to electromagnetic radiation.

6. An arrangement for displacing an image using electromagnetic radiation of a reproduction beam having a beam direction, the image being displaced perpendicular to the beam direction by use of a rotatably arranged radiation-refracting body that is disposed in a course of the reproduction beam and that has a refraction index different from an ambient medium with respect to the radiation, wherein the radiation-refracting body comprises at least one of either a plane parallel medium or a glass plate, the arrangement comprising:

a measuring device;

an interferometer, distinct from the measuring device, directing a measurement beam, distinct from the reproduction beam, toward the radiation-refracting body as the radiation-refracting body rotates, wherein said measurement beam impinges on an area of the radiation-refracting body for each of various rotational positions of the radiation-refracting body, wherein at a given rotational position the measurement beam comprises a first radiation component and a corresponding second radiation component, wherein the first radiation component of the measurement beam passes through the radiation-refracting body to a flat reflecting surface distinct from the radiation-refracting body where it is reflected back to and at least in part through the radiation-refracting body and onward to the interferometer to have a different wavelength than the measurement beam as directed to an incident surface of the radiation-refracting body, and wherein the corresponding second radiation component is reflected from the incident surface to the measuring device;

said measuring device receiving the corresponding second radiation component and deriving from the corresponding second radiation component a position-dependent electrical signal to provide a reference point of origin for motion of the radiation-refracting body;

wherein the interferometer measures rotation of the radiation-refracting body by determining an optical path length change in the measurement beam caused by the radiation-refracting body, wherein said determining comprises evaluating radiation of the first radiation component reflected back to and at least in part through the radiation-refracting body to the interferometer relative to radiation corresponding to the measurement beam directed from the interferometer to the incident surface of the radiation-refracting body; and a control unit receiving the position-dependent electrical signal and the measured rotation for controlling rotation and offset of the radiation-refracting body so as to displace said image of the radiation-refracting body in response to the reproduction beam, and wherein the control unit controls said rotation and offset of the radiation-refracting body to achieve a desired absolute displacement of the image relative to said reference point of origin, based on the measured rotation of the radiation-refracting body and said offset of the radiation-refracting body relative to said reference point of origin as determined from the measured rotation and the position-dependent electrical signal using said first component and corresponding second component as occurring during a rotational interval of the rotating body.

7. An apparatus according to claim 6, further comprising a wavelength-dependent filter and/or polarization-dependent filter being attached upstream of the measuring device for the portion of the radiation directly reflected on the radiation-refracting body.

8. An apparatus according to claim 6, wherein the measuring device includes detectors that are sensitive to electromagnetic radiation, by which the position-dependent signal is formed from a difference in respective intensities.

9. An apparatus according to claim 6, wherein the measuring device includes at least one detector that is sensitive to electromagnetic radiation, by which the position-dependent signal is formed directly.

10. An apparatus according to claim 6, wherein a rotational axis of the radiation-refracting body runs through the incident surface thereof that the reproduction beam and/or the measurement beam strike.

11. An apparatus according to claim 6, wherein the reproduction beam and/or the measurement beam intersect a rotational axis of the radiation-refracting body.

* * * * *